United States Patent
Niu et al.

(10) Patent No.: US 10,090,839 B2
(45) Date of Patent: Oct. 2, 2018

(54) RECONFIGURABLE INTEGRATED CIRCUIT WITH ON-CHIP CONFIGURATION GENERATION

(71) Applicant: Imperial Innovations Limited, London (GB)

(72) Inventors: Xinyu Niu, London (GB); Wayne Luk, London (GB)

(73) Assignee: Imperial Innovations Limited, London (GB)

( * ) Notice: Subject to any disclaimer, the term of this patent is extended or adjusted under 35 U.S.C. 154(b) by 0 days.

(21) Appl. No.: 15/503,034

(22) PCT Filed: Aug. 12, 2015

(86) PCT No.: PCT/GB2015/052331
§ 371 (c)(1),
(2) Date: Feb. 10, 2017

(87) PCT Pub. No.: WO2016/024111
PCT Pub. Date: Feb. 18, 2016

(65) Prior Publication Data
US 2017/0244414 A1  Aug. 24, 2017

(30) Foreign Application Priority Data
Aug. 12, 2014 (GB) .................. 1414286.3

(51) Int. Cl.
*H03K 19/177* (2006.01)
(52) U.S. Cl.
CPC ... *H03K 19/17752* (2013.01); *H03K 19/1776* (2013.01)

(58) Field of Classification Search
None
See application file for complete search history.

(56) References Cited

U.S. PATENT DOCUMENTS

| | | | | |
|---|---|---|---|---|
| 6,255,849 B1 * | 7/2001 | Mohan | ............ | H03K 19/17752 326/38 |
| 7,644,385 B1 * | 1/2010 | Boyle | ............ | H03K 5/131 326/38 |
| 7,950,017 B1 * | 5/2011 | Cain | ............ | G06F 9/545 719/310 |
| 2007/0153726 A1 * | 7/2007 | Bar-Sade | ............ | H04L 1/0002 370/329 |
| 2009/0031106 A1 * | 1/2009 | Honda | ............ | H03K 19/17728 712/29 |
| 2014/0165021 A1 | 6/2014 | Stephanou et al. | | |

FOREIGN PATENT DOCUMENTS

WO  0124030 A2  4/2001

OTHER PUBLICATIONS

PCT Patent Application PCT/GB2015/052331; International Search Report and Written Opinion dated Nov. 2, 2015.

* cited by examiner

*Primary Examiner* — Crystal L Hammond
(74) *Attorney, Agent, or Firm* — Erise IP, P.A.

(57) ABSTRACT

Reconfigurable Integrated Circuit with On-Chip Configuration Generation A circuit and method are provided in which reconfiguration is achieved through the modification of a dynamic data path using configuration information generated on the basis of run-time variables. Rather than storing a plurality of pre-set configurations, this can allow configurations optimized to processing tasks to be implemented during operation.

14 Claims, 7 Drawing Sheets

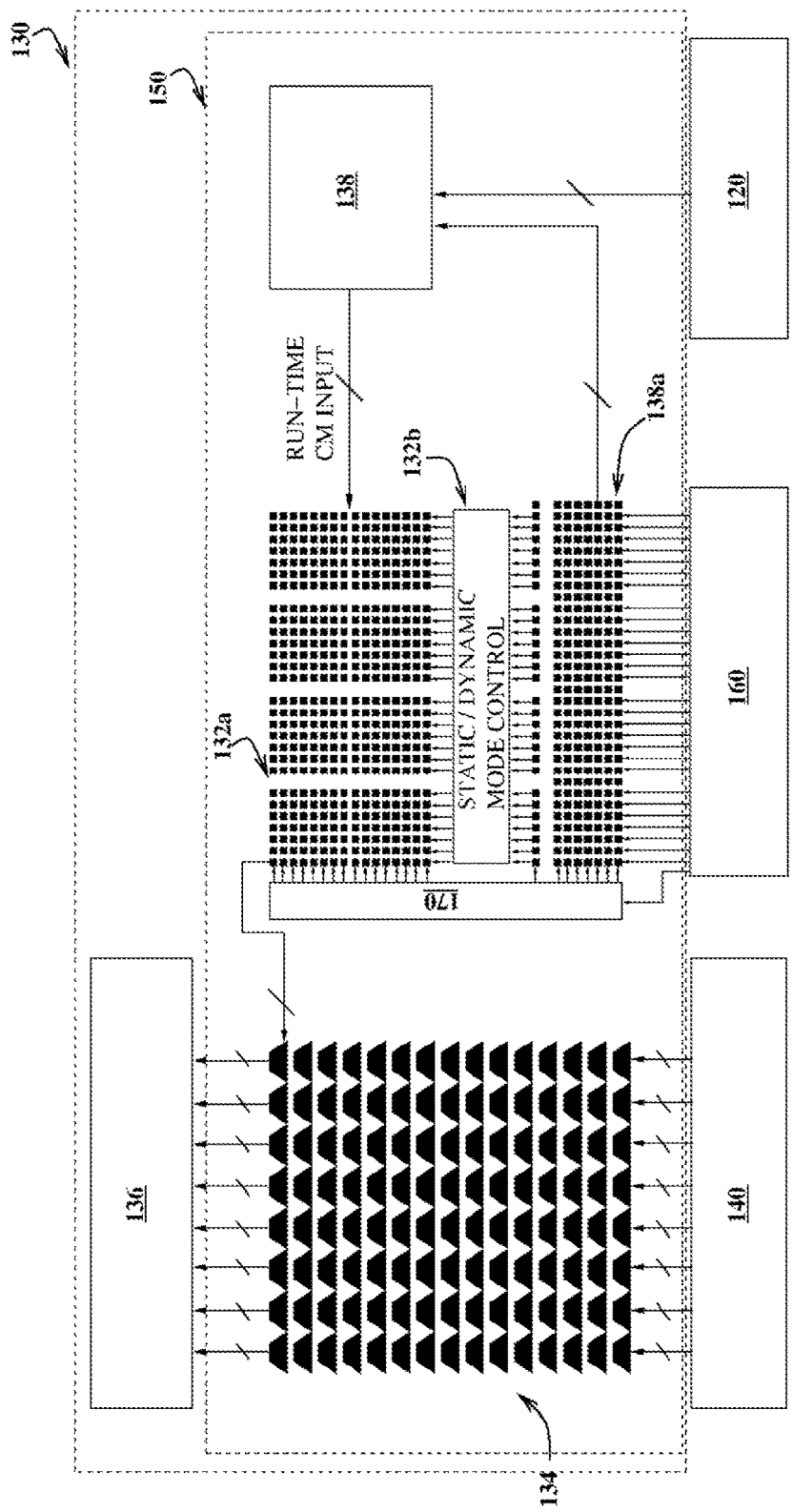

RECONFIGURABLE INTEGRATED CIRCUIT WITH ON-CHIP CONFIGURATION GENERATION

RELATED APPLICATIONS

The present application is a national stage application under 35 U.S.C. § 371 of International Application No. PCT/GB2015/052331, filed 12 Aug. 2015, and which claims priority from GB Application No. 1414286.3, filed 12 Aug. 2014. The above-referenced applications are hereby incorporated by reference into the present application in their entirety.

FIELD OF THE INVENTION

The present invention relates to a reconfigurable processing architecture. In particular, but not exclusively, the present invention relates to an architecture for dynamically configuring a Field-Programmable Gate Array (FPGA).

BACKGROUND TO THE INVENTION

Field-Programmable Gate Arrays (FPGAs) are integrated circuits designed to be configurable after manufacturing, whether by an end user or by other parties to the design process. They offer significant advantages over general purpose processing units in the ability to offer optimised circuit design for particular purposes, such as financial modeling or signal processing. Optimised circuit design can provide orders of magnitude increases in performance and power efficiency. At the same time, they offer a more flexible solution than fixed-function Application Specific Integrated Circuits (ASICs) due to their ability to be configured after manufacture.

The configuration of an FPGA is typically captured in a hardware description language (HDL) code stored on a configuration memory (CM). Compared to an ASIC, a single FPGA device can offer multiple functionalities depending on the configuration stored in its CM.

In practice, this ability to avoid constructing hardware fabrication facilities while providing chips with particular functionality is often the principal drive behind the adoption of FPGA technology. Once in use, the FPGA often functions as a static circuit, operating according to the single configuration stored in an associated CM.

While this approach does bring cost advantages at the manufacturing stage, to the end user the effect is a limited integrated circuit with little or no additional flexibility beyond that provided by an ASIC. If the FPGA is intended for use in a range of tasks, then its configuration must implement all possible operations statically, leading to redundancy since not all of these are used all the time, so some resources can become idle some of the time. As the range of available operations increases, the advantages over general purpose processing units rapidly disappear. In essence, the hardware configuration is no longer optimised to a particular task but instead carries the overheads present in general purpose processing units.

Thus a device with a single configuration is an inefficient approach to providing a dynamic range of processing capabilities. Run-time reconfiguration techniques are used to separate a single configuration into multiple efficient configurations, when a dynamic range of tasks are required. For example, in "Automating Elimination of Idle Functions by Run-Time Reconfiguration", FCCM 2013, pp. 97-104, application functions used at different time are separated into different configurations, to free resources occupied by idle resources. The major challenge of run-time reconfiguration techniques is the reconfiguration time, which is the time to download a configuration into a reconfigurable device before it can be used. To reduce the reconfiguration time, partial reconfiguration techniques can be applied to only update the regions that are different in successive configurations. In "An area-efficient partially reconfigurable crossbar switch with low reconfiguration delay," FPL, 2012, pp. 400-406 and "Staticroute: A novel router for the dynamic partial reconfiguration of FPGAs," FPL, 2013, pp. 1-7, similarities in configurations are exploited to further reduce the partial reconfiguration time. However, run-time reconfiguration techniques, for either full reconfiguration or partial reconfiguration, are still limited by the reconfiguration time, since off-chip configurations need to be loaded onto a reconfigurable device during runtime. As an example, in "A high I/O reconfigurable crossbar switch," FCCM, 2003, pp. 3-10, it takes 220 us to reconfigure a crossbar running at 150 MHz. For applications where dynamic tasks change frequently, the reconfiguration time can outweigh the benefits gained from separating the dynamic tasks. Also, as reconfigurable chips such as FPGAs get larger, the time required to fully reconfigure a chip becomes longer.

Since the configuration of an FPGA is dependent upon the CM, an alternative approach has been proposed in which the FPGA is coupled to a number of different CMs. In this approach, the appropriate CM (and thus configuration) is selected according to the required task (e.g. on the basis of one or more run time variables). Accordingly, under different run-time scenarios, only the required operators are implemented.

U.S. Pat. No. 5,426,378 to Randy T. Ong entitled "Programmable Logic Device Which Stores More Than One Configuration and Means for Switching Configurations" describes a programmable logic device with a CM expanded to store two or more complete sets of configuration data. During runtime, outputs from the expanded CM sets are selected. The reconfiguration operation can be finished within a user's clock cycle.

U.S. Pat. No. 6,829,756 B1 to Stephen M. Trimberger entitled "Programmable Logic Device with Time-Multiplexed Interconnect" describes a programmable logic device with interconnect configured with expanded CM sets. The expanded CM sets enable an interconnect to be reconfigured within a cycle. Therefore multiple resources can use the same interconnect at different time, which reduces redundant interconnections.

U.S. Pat. No. 8,664,974 B2 to Rohe et al. entitled "Operational Time Extension" describes an integrated circuit containing reconfigurable circuits configured with multiple CM sets, each named a time-extending reconfigurable circuit. During runtime, multiple time-extending reconfigurable circuits construct a signal path. Each time-extending reconfigurable circuit maintains one of its CM sets over at least two contiguous cycles, to allow signals to propagate through the signal path within a desired amount of time.

However, in order to provide a large number of configurations stored on chip, a large number of CMs are required. This necessitates significant memory storage on chip, implying a large area and power overhead, reducing the efficiency of the overall hardware design. Moreover, the additional memory area is fixed once the FPGA is fabricated. Storing configurations off-chip has been suggested, but in this scenario reconfiguration takes many cycles to complete, resulting in unacceptable delay.

There is therefore much ongoing desire to address the inefficiencies and limitations of these designs and to provide an improved reconfigurable architecture.

SUMMARY OF THE INVENTION

According to a first aspect of the present invention, there is provided a reconfigurable integrated circuit for carrying out a plurality of processing tasks, comprising
a configuration generator; and
a dynamic data path comprising one or more control units comprising configuration memory, wherein
the configuration memory is adapted to store a modifiable configuration for the dynamic data path,
the configuration generator is adapted to receive one or more run-time variables, and to generate configuration information to modify the stored configuration in dependence on the one or more run-time variables, and
the one or more control units are adapted to receive and apply the configuration information from the configuration generator to modify the configuration stored in the configuration memory, thereby optimising the dynamic data path for a required processing task.

The present invention can apply a range of configurations to a dynamic data path without a requirement for all configurations to be stored in memory prior to operation. The configuration stored in the dynamic data path's configuration memory is modified in response to configuration information generated by the configuration generator. As a result, a dynamic and efficient modification of the data path may be carried out without the area overhead associated with memory storage for a large number of configurations. Furthermore, since configurations are generated during operation, it is not necessary for all possible configurations to be established prior to the operation of the integrated circuit.

The configuration memory and the dynamic data path are part of an integrated circuit, and are thus provided on the same chip. As such, communication between the configuration generator and the control units of the dynamic data path may take place within a cycle and does not introduce multi-cycle delay in updating the configuration applied to the dynamic data path.

Preferably, the circuit further comprises one or more adaptive data routers arranged to adaptively route data from a data memory through the dynamic data path in dependence on the stored configuration. The adaptive data routers may be adaptive I/O ports. The data memory may be included in the integrated circuit or may be provided off-chip; it may, for example, be on-chip memory blocks or off-chip DRAM. In this manner, by modifying the configuration, the routing of data from the data memory through the adaptive data routers to the dynamic data path may be modified, thereby allowing the dynamic data path to be connected to the required data memory flexibly and efficiently. This can increase access speed of data moving between the required data memory and the dynamic data path, resulting in improved performance.

Preferably a plurality of adaptive data routers are provided. More preferably, the plurality of adaptive data routers are provided in parallel. Furthermore, in preferred embodiments the plurality of adaptive data routers are arranged to connect appropriate locations in the data memory to the appropriate dynamic data path. This efficient architecture ensures optimum use of memory and processing resources.

In preferred embodiments, the run-time variables are dependent upon run-time data access patterns. As such, the run-time variables used to generate the modified configuration can be a function of required data access patterns for the current processing task. In this manner, the data access patterns can be rapidly supported by the operations of the dynamic data path, thereby increasing efficiency of processing and reducing the requirement for memory storage.

The run-time variables may comprise information received from the dynamic data path. In this manner, feedback from the dynamic data path can be used to update subsequent configuration information.

Preferably, each adaptive data router is coupled to a control unit adapted to receive configuration information from the configuration generator, wherein the adaptive data router acts in accordance with the configuration stored in the control unit. This architecture allows the adaptive data routers to operate efficiently and respond quickly to changes driven by the configuration generator.

Preferably, the circuit further comprises a signal distribution network for distributing configuration information from the configuration generator to the control units, wherein the signal distribution network may supply the same configuration information to multiple control units. By applying the same configuration information to multiple control units, the behaviour of multiple adaptive data routers can be correspondingly altered. This efficient architecture can allow optimisation to avoid replicating configuration information. Supplying the same configuration information to multiple control units may comprise applying the same changes to multiple bits of configuration memory.

The dynamic data path preferably comprises one or more data path operators which can be static or adaptive. Static data path operators carry out the same operation on data received regardless of the state of the configuration memory, whereas adaptive data path operators may be modified in response to modifications of the stored configuration.

In preferred embodiments, the integrated circuit comprises a reconfigurable architecture, and may be a field programmable gate array.

According to a second aspect of the present invention, there is provided a method for reconfiguring an integrated circuit comprising:
storing a modifiable configuration in a configuration memory which defines the configuration of a dynamic data path;
receiving run-time variables at a configuration generator;
generating configuration information at the configuration generator to modify the stored configuration in response to the received run-time variables; and
applying the configuration information from the configuration generator to modify the stored configuration, thereby optimising the dynamic data path for a required processing task.

The method of the second aspect can provide advantages such as those described above with relation to the first aspect. Preferred elements of the first aspect may also be applied to the second aspect.

BRIEF DESCRIPTION OF THE DRAWINGS

Preferred embodiment of the present invention will now be described with reference to the accompanying drawings, in which:

FIG. 5 illustrates a schematic of an optimised architecture for a reconfigurable circuit.

DETAILED DESCRIPTION

Figure 1:
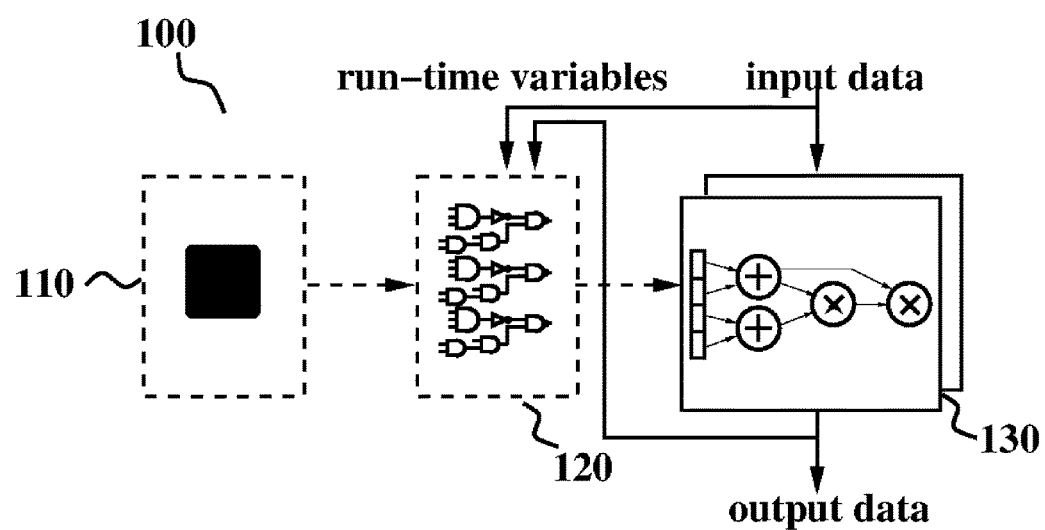
FIG. 1 provides a schematic view of elements of a reconfigurable integrated circuit.

Referring to FIG. 1, there is shown a reconfigurable integrated circuit 100 according to an embodiment of the present invention. The integrated circuit 100 in this embodiment is a Field Programmable Gate Array (FPGA) 100, although alternative programmable circuits may be used. The FPGA 100 comprises a configuration generator memory 110, a configuration generator 120 and a dynamic data path 130. The configuration generator memory 110 stores a configuration for the configuration generator 120, which in the preferred embodiment is implemented using an FPGA configurable logic block. The configuration generator memory 110, the configuration generator 120 and the dynamic data path 130 are mounted on a single chip.

Figure 2:
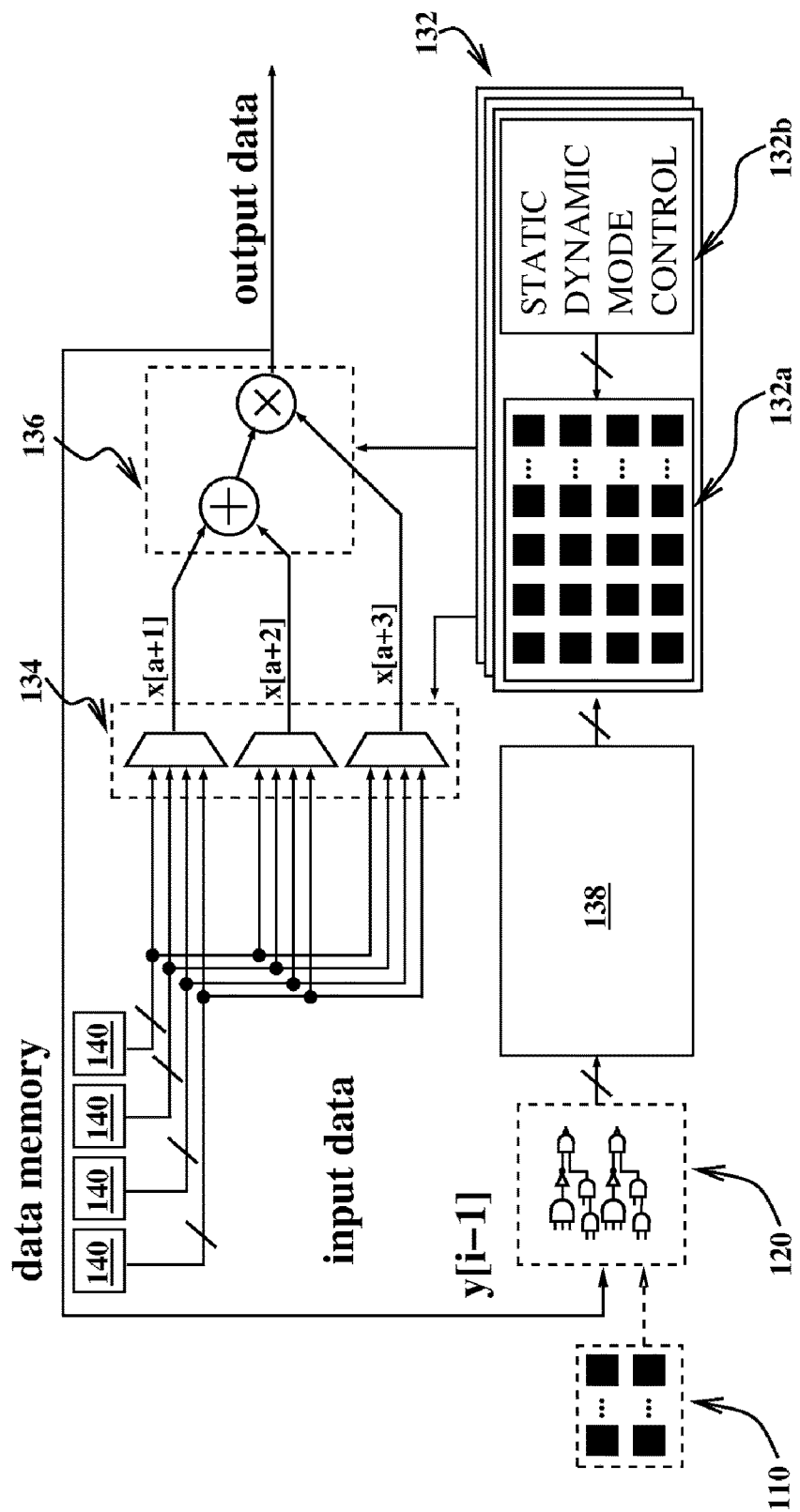
FIG. 2 shows the connection of a reconfigurable circuit to multiple memory banks.

The dynamic data path 130 is illustrated in more detail in FIG. 2, and comprises a plurality of control units 132 and adaptive data routers 134, wherein each control unit 132 is coupled to an associated adaptive data router 134. There are further provided a number of data path operators 136 implemented by FPGA fine-grained configurable logic blocks or coarse-grained arithmetic elements. The control units 132 comprise configuration memory 132a to store a configuration defining: (a) the status of the adaptive data routers 134 and (b) the function of the data path operators 136. The adaptive data routers 134 couple a provided data memory 140 to the data path operators 136 which output the result of a required data processing function. The data memory may be provided on the same chip as integrated circuit 100 (i.e. it may form part of integrated circuit 100) in FIG. 1, or may be provided externally.

The configuration generator 120 receives as input one or more run-time variables, which may include information from the dynamic data path 130 and/or from the configuration generator memory 110, and generates configuration information for modifying the configuration stored in the control units 132. The configuration generator 120 transfers configuration information through the signal distribution network 138 to the control units 132. When in a dynamic mode, the control units 132 modify the configuration stored in the configuration memory 132a on receipt of the configuration information. Preferably in this example, the control units 132 only update the configuration memory of the adaptive data routers 134, while the configuration memory of the data path operators 136 remains the same. As the adaptive data routers 134 operate according to the configuration provided in their associated control unit 132, this enables the operation of the adaptive data routers 134 to be modified dynamically according to configuration information. This dynamically modifies the coupling of particular areas of data memory 140 to the data path operators 136. In particular, the adaptive data routers 134 can map different areas of the data memory to the available data path operators 136 during operation of the circuit 100.

Each control unit 132 may be placed in a dynamic mode or a static mode. The selection of dynamic or static mode may be effected by selection element 132b also provided in the control unit. When in dynamic mode, the configuration stored in configuration memory 132a can be modified by configuration information from the configuration generator 120 as outlined above. When in static mode, the control unit 132 ignores configuration information from the configuration generator and retains the same configuration in the configuration memory 132a.

The operation of the integrated circuit can be further understood with reference to the following exemplary algorithm:

| | |
|---|---|
| 1. | int* x, int* y |
| 2. | for i ∈ 1 → N − 1 do |
| 3. | a = y[i−1]; |
| 4. | y[i] = (x[a+1] + x[a+2]) * x[a+3]; |
| 5. | end for |

In this example, x and y are respectively input and output arrays. Data accesses of x depend on the result of previous operations y[i−1]. With reference to FIG. 2, the data in x are stored in four on-chip memory blocks of the data memory 140. Thus, for each cycle of the algorithm, the appropriate data from x must be retrieved from the data memory according to the relevant run-time variables, in this case defined by the output y[i−1]. This means that the routing of data must be carried out dynamically.

This dynamic data routing can be achieved by the integrated circuit 100 because the result y[i−1] is returned to the configuration generator 120 as a run-time variable, which may then adaptively provide configuration information via a signal distribution network 138 to the control units 132 in dependence on this variable to modify the configuration stored in the configuration memory 132a of each control unit. This in turn modifies the behaviour of the adaptive data routers 134 associated with the control units in order to selectively route the correct data from x stored in data memory 140 to the data path operators 136 to carry out further processing. As the configuration generator 120 is able to dynamically generate configuration information during operation, there is no need for multiple distinct configurations to be stored on chip when not required. Moreover, the architecture of the integrated circuit 100 allows dynamic configuration to be applied to the dynamic data path 130 within one cycle, rather than requiring multiple cycles for reconfiguration.

Accordingly, the configuration generator 120 takes run-time variable y[i−1] and generates configurations for the dynamic data path 130 cycle-by-cycle. At each cycle, three values of x data are retrieved from data memory 140 and delivered to the data path operators 136, and one result is generated. Routing resources (i.e. adaptive data routers 134) in the circuit 100 are dynamically re-used to implement cycle-by-cycle connections where necessary under each run-time condition.

The benefits of the architecture of the circuit 100 according to the embodiment described in FIGS. 1 and 2 can be understood with reference to a metric of architecture efficiency defined as E=R/O, where E is the architecture efficiency, R is architecture reconfigurability and O is architecture overhead.

The architecture reconfigurability R is defined as the minimum of $r_{cap}$ (routing capacity for dynamic data access), $r_{cfg}$ (number of distinct configurations supported) and D (number of possible connections for dynamic data access). In the embodiment described above with reference to FIG. 2, there are four possible connections (D=4), each adaptive data router is routed to four different incoming wires ($r_{cap}$=4) and these are reconfigured by a two-bit control module 132a ($r_{cfg}$=4). Accordingly, R=4.

The architecture overhead O is defined as O=$o_a \cdot o_t$, where $o_a$ is the area overhead and $o_t$ is the time overhead. The area overhead $o_a$ is the ratio of the area of the runtime configurable circuit compared with an initial statically configurable architecture. The time overhead $o_t$ is defined as $(t_r+t_p)/t_p$ where $t_r$ is the reconfiguration time in terms of cycles and $t_p$ is the number of cycles between two reconfigurations. The overhead O thus accounts for the overall impact of implemented design on area and time.

An optimum system supports unlimited reconfigurability with no area overhead and no time overhead ($o_a$ and $o_t$ would equal 1) giving an efficiency E directly proportional to the desired number of possible connections D. This ideal scenario is illustrated as line 301 in FIG. 3.

Figure 3:
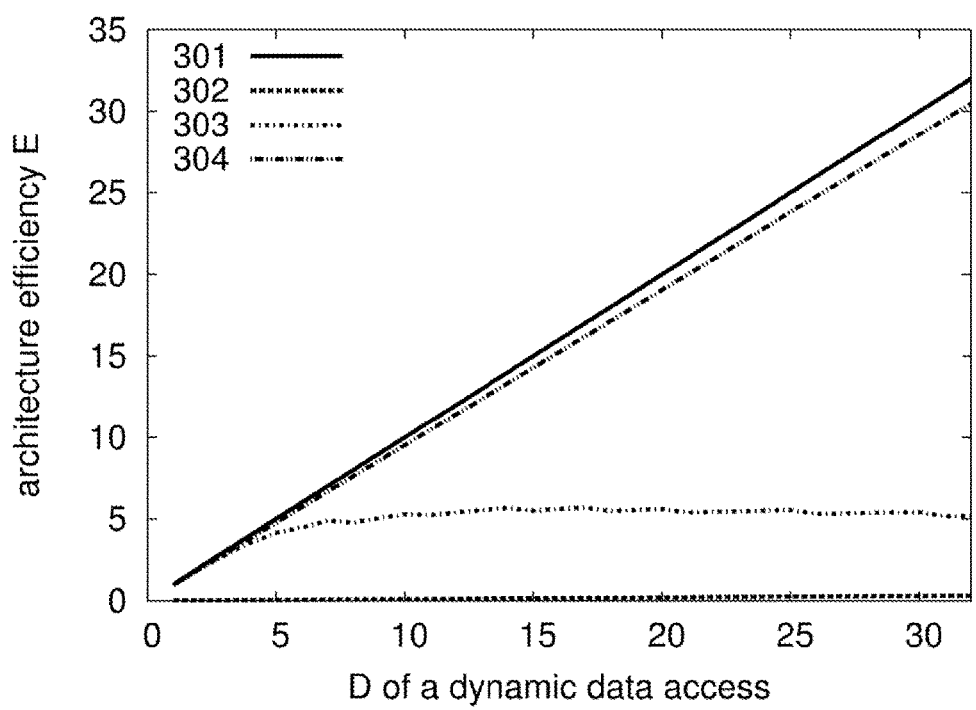
FIG. 3 illustrates architectural efficiency of different approaches to reconfigurable circuits.

FIG. 3 also shows architectural efficiency E as a function of D for a system which uses off-chip reconfiguration (line 302), a system in which multiple configurations are stored in distinct configuration memories on chip (line 303) and a system according to the present invention in which a configuration generator is used to adaptively modify the configurations applied to a dynamic data path (line 304).

In off-chip reconfiguration as reflected in line 302, configurations are independently established and then loaded into a configuration memory on the chip. Such an approach should provide unlimited $r_{cfg}$ but suffers significantly from time overhead in implementing any reconfiguration. For example, consider a device with an addressable configuration size of 3232 bits and a maximum configuration throughput of 400 MB/s. Such a device is typical of current devices. The minimum reconfiguration time by these figures is at least 1.01 us. If we assume an operation frequency of 100 MHz then at least 101 clock cycles are consumed for a reconfiguration operation. In the example algorithm given above, configurations need to be updated cycle by cycle, meaning that for such a device 1 result is generated every 102 cycles ($o_t$=102). As a result, we can see from line 302 in FIG. 3 that efficiency is far from optimal.

Another proposed prior art approach is to provide a plurality of configuration memories on-chip, each storing a different configuration. A selection is made during run-time of which configuration to apply to the dynamic data path. In this scenario, it may be possible for configurations to be updated within a cycle (as they are stored on-chip and do not need to be retrieved from an external source). However, the provision of a plurality of separate configurations increases the area overhead $o_a$. When the required dynamic connections D increases, there is a need for a corresponding increase in stored configurations to ensure that the required configurations can be supported (i.e. $r_{dep}$=D). However, this means expanding the configuration memories in connection blocks and significantly increases the overall architecture area. As shown by line 303 in FIG. 3, the efficiency E of this solution is only around 5 when D=32. This suggests an area overhead $o_a$ of 6.15.

Line 304 shows the efficiency E that may be achieved using an optimised approach based on the principles of the present invention, in which a configuration generator 120 is used to dynamically modify the configuration of a dynamic data path 130. As explained above, this solution does not introduce time overhead $o_t$ since configuration can be modified dynamically within a cycle. Furthermore, the area overhead $o_a$ is also low, since the configuration generator 120 and the configuration generator memory 110 can be respectively implemented in existing configurable logic and configuration memory of a current FPGA architecture. Some area overhead arises from additional routing area provided on-chip. However, the impact of this can be kept relatively small by suitably optimised architectural design, and as a result line 304 may be relatively close to the ideal line 301 in FIG. 3.

In practice, it is found that an optimised architecture may take advantage of a number of factors relevant to the tasks that the circuit 100 is applied to. For example, in many tasks, not all adaptive data routers 134 need to adapt during operation. As such, a plurality of the control units 132 can be set to the static mode. Furthermore, it is not always necessary or appropriate to provide bit-level granularity for control of adaptive data routers 134. For example, the required degree of granularity may be at byte level or above (i.e. shifts in the addressable memory carried out by the adaptive data routers 134 may be in steps of a byte or more). Moreover, in many tasks, common shifts may be applied to multiple adaptive data routers 134, meaning that shared configuration information may be routed from the configuration generator 120 to multiple control units 132.

Figure 4A:
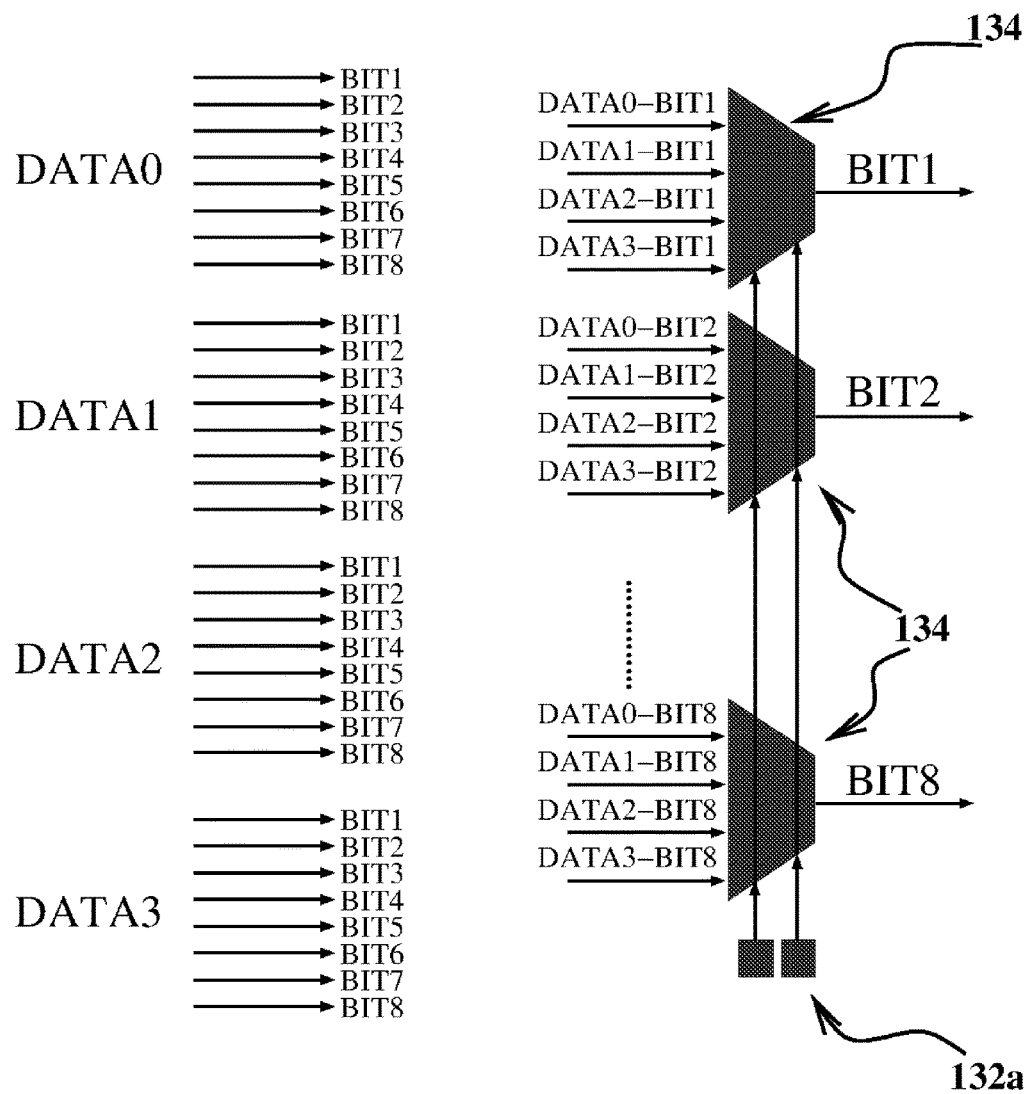
FIG. 4A illustrates the connection of 8 bit data arrays to adaptive data routers.

For example, consider four 8 bit data sets, labelled DATA0, DATA1, DATA2 and DATA3. It may be desirable to choose which data set to retrieve data from, and to retrieve all 8 bits of that particular set in parallel. This can be achieved using 8 independent adaptive data routers, each configured to retrieve a given bit from the data set to which they are coupled. This is illustrated in FIG. 4A. Here a control unit 132 comprising a two bit configuration memory 132a can be used to control all eight adaptive data routers to select which data set will be retrieved. For example, configuration 00 may select DATA0, 01 may select DATA1, 10 may select DATA2 and 11 may select DATA3.

Figure 4B:
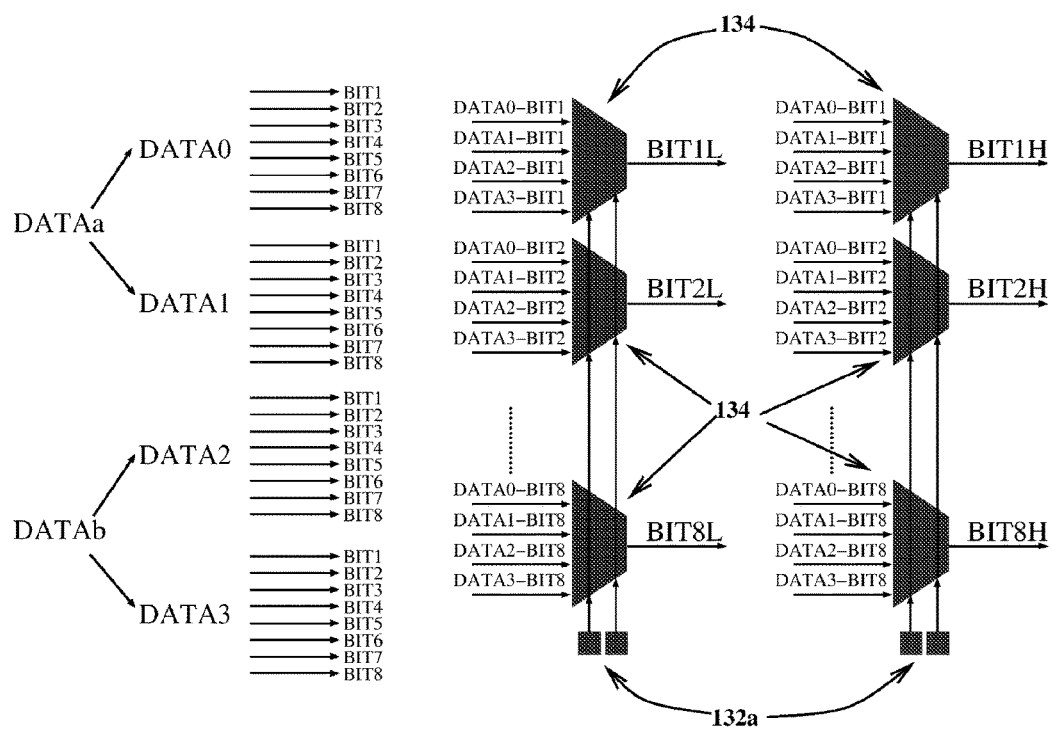
FIG. 4B illustrates the connection of 16 bit data arrays to adaptive data routers.

FIG. 4B illustrates the situation with the above four 8-bit data sets interpreted as two 16-bit data sets, referred to as DATAa and DATAb. Both DATAa and DATAb consist of bits 1L to 8L and bits 1H to 8H. There are now sixteen adaptive data routers 134, but to select between the data sets we only need the degree of freedom provided by a single bit of configuration memory. For example, DATAa may be selected using configuration 00 for bits 1L to 8L and configuration 01 for bits 1H to 8H, while DATAb may be selected using configuration 10 for bits 1L to 8L and 11 for bits 1H to 8H. Thus, the lower bit can be fixed as static during operation and the higher bit can be dynamically shared by the control units 132 attached to all the relevant adaptive data routers 134.

As such, depending on operational circumstances, the number of bits of configuration memory 132a in the control units 132 which share configuration information from the configuration generator 120 will vary. Thus, the distribution of configuration information from the configuration generator 120 is preferably configurable. Similarly, the selection of dynamic mode or static mode for various control units 132 can vary.

An optimised architecture is illustrated in FIG. 5. Like reference numerals are used for like features as compared to the embodiment shown in FIG. 2. In this example, the dynamic data path 130 is connected to a configuration generator 120. To allow for the varying requirements for the signal distribution network, a number of distribution control units 138a are also provided. The distribution control units are configuration memories which are static during operation and configure the signal distribution network 138. The distribution control units also define which of the control units 132 or elements of the control units 132 are in static or dynamic mode and thus able to receive configuration information from the configuration generator 120 via the signal distribution network 138.

FIG. 5 also illustrates a configuration initialisation port 160 which operates with a row decoder 170 to initialise the distribution control units 138a and control units 132. The data memory 140 is connected to the adaptive data routers 134 by the on-chip memory I/O ports and/or FPGA I/O ports from off-chip memory.

The signal distribution network 138, the control units 132, the distribution control units 138a, the row decoder 170, and the adaptive data routers 134 are usually combined to form an integrated adaptive module 150.

Figure 6:
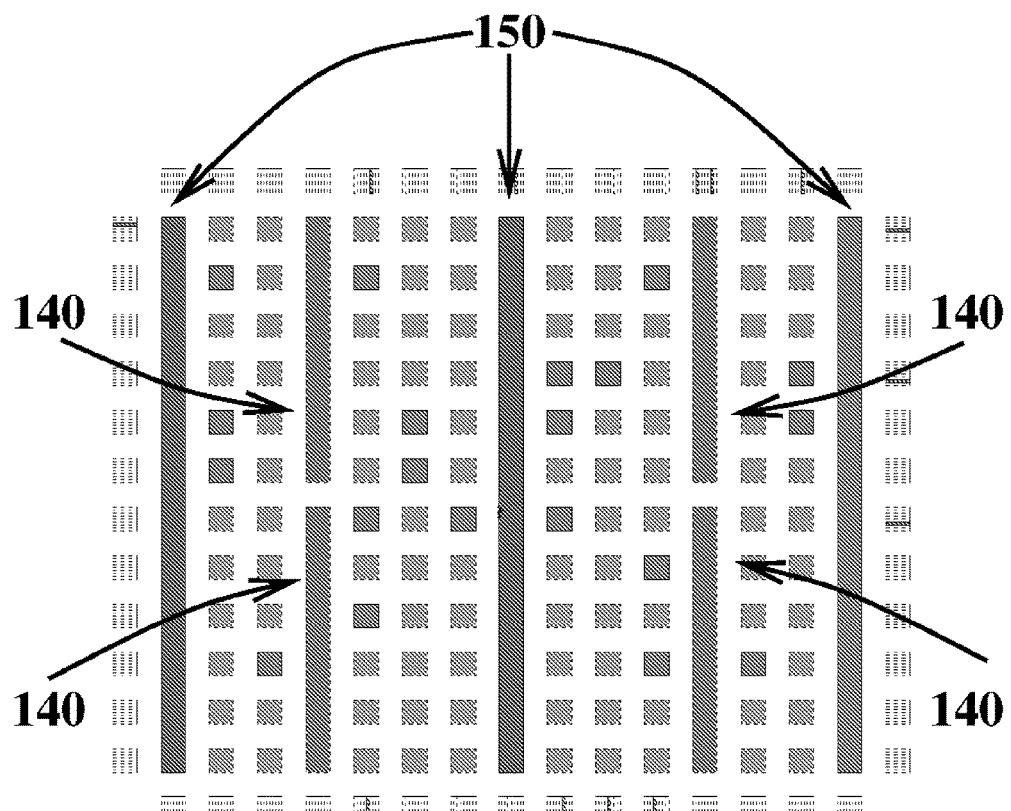
FIG. 6 shows a plan view of the physical layout of a reconfigurable circuit.

The physical layout of an embodiment such as that illustrated in FIG. 5 is shown in FIG. 6. Here, adaptive data routers 134 and the associated control units 132 are combined into integrated adaptive modules 150. Also shown are memory banks 140 mounted on the chip 100 together with configurable logic blocks which act as the configuration generator 120 and as the dynamic data path 130/data path operators 136.

The above-referenced embodiments of the present invention find particular utility in a range of processing tasks requiring dynamic data access. In order to understand this more fully, four examples will be presented in more detail below. These are web service processing (Memcached), embedded systems (H.264), graph traversal (breadth-first search), and data management (sorting).

First, Memcached is widely used in large scale web servers. Frequently accessed data are stored in distributed memory systems, and accessed through hash tables. In software solutions, the hash tables are managed in off-chip memories. A key pointer it and a key size nkey are used to search target keys in the hash tables. By utilising the processes described above, the hash table may be stored in a byte addressable data memory 140. At each cycle, proper connections can be configured using it and nkey as the run-time variables input to the configuration generator 120. In this way, only active data access patterns are implemented.

Second, H.264 is a widely used video compression standard. In a H.264 software design, dynamic data access operations exist in various modules. Processing in H.264 is based on 16×16 macro-blocks. Each macro-block contains 16 4×4 blocks. Intra-prediction algorithms predict values in a 4×4 block, based on its neighbouring blocks. Nine prediction modes are supported. By using a reconfigurable circuit 100 as described above, neighbouring data can be dynamically accessed in parallel, and the output results can be dynamically distributed into a target array.

Third, Breadth-First Search (BFS) is a graph exploration algorithm that is used in graph-based applications, such as neural simulation, data routing, and network security. BFS traversals label graph vertices with BFS levels, which indicates the distance between the traversed vertex and the source vertex. As an example, to find vertices in BFS level 3, vertices in BFS level 2 are traversed. Adjacent vertices of these traversed vertices are labelled as BFS level 3, if they have not been labelled before. Design challenges for a BFS algorithm arise from its sparse and random data accesses. Assume we have M vertices in level 2, and each vertex has N adjacent vertices, M×N off-chip random data accesses are issued, to find vertices in BFS level 3. By using the dynamic design of the circuits described in the above-mentioned embodiments, dynamic data access patterns can be efficiently implemented. For example, configurations can be generated based on the index of each vertex. Connections between input addresses and memory banks can be dynamically reconfigured.

Fourth, in parallelised data sorting problems, small sorted arrays can be merged in parallel, to enable parallel sorting of large-scale data. However, an approach with sorted data stored in FIFOs can generate errors when data are retrieved in subsequent operations, since without intervention these will not be retrieved in the correct order. Dynamic data access using the above-described embodiments can be used to ensure data that have been stored are retrieved in the correct order.

Other variations and modifications will be apparent to the skilled person. Such variations and modifications may involve equivalent and other features which are already known and which may be used instead of, or in addition to, features described herein. Features that are described in the context of separate embodiments may be provided in combination in a single embodiment. Conversely, features which are described in the context of a single embodiment may also be provided separately or in any suitable sub-combination.

It should be noted that the term "comprising" does not exclude other elements or steps, the term "a" or "an" does not exclude a plurality, a single feature may fulfill the functions of several features recited in the claims and reference signs in the claims shall not be construed as limiting the scope of the claims. It should also be noted that the Figures are not necessarily to scale; emphasis instead generally being placed upon illustrating the principles of the present invention.

The invention claimed is:

1. A reconfigurable integrated circuit for carrying out a plurality of processing tasks, comprising:
   a configuration generator; and
   a dynamic data path comprising one or more control units comprising configuration memory, and one or more adaptive data routers arranged to route data from a data memory through the dynamic data path, the data memory storing the data to be processed,
   wherein the configuration memory is adapted to store a modifiable configuration for the dynamic data path,
   wherein the configuration generator is adapted to receive one or more run-time variables and to generate configuration information to modify the stored configuration in dependence on the one or more run-time variables,
   wherein the one or more control units are adapted to receive and apply configuration information from the configuration generator to modify the stored configuration, and
   wherein the one or more adaptive data routers are adapted to modify the dynamic data path for a required processing task by routing data from the data memory through the dynamic data path in accordance with the modified stored configuration.

2. A circuit according to claim 1, comprising a plurality of adaptive data routers.

3. A circuit according to claim 2, wherein the plurality of adaptive data routers are provided in parallel.

4. A circuit according to claim 1, wherein each adaptive data router is coupled to a control unit adapted to receive configuration information from the configuration generator, wherein the adaptive data router acts in accordance with the configuration stored in the control unit.

5. A circuit according to claim 1, further comprising a signal distribution network for distributing configuration information from the configuration generator to the control units, wherein the signal distribution network may apply the same configuration information to multiple control units.

6. A circuit according to claim 1, wherein the run-time variables are dependent upon run-time data access patterns.

7. A circuit according to claim 1, wherein the dynamic data path further comprises one or more data path operators.

8. A circuit according to claim 1, wherein the circuit is a field programmable gate array.

9. A method for reconfiguring an integrated circuit comprising:
   storing, in a data memory, data to be processed;
   storing a configuration in a configuration memory which defines the configuration of a dynamic data path;
   routing, by one or more adaptive data modules, data from the data memory through the dynamic data path in accordance with the stored configuration;
   receiving run-time variables at a configuration generator;
   generating configuration information at the configuration generator to modify the stored configuration in response to the received run-time variables;
   applying the configuration information from the configuration generator to modify the stored configuration; and
   modifying the dynamic data path for a required processing task by routing, by the one or more adaptive data modules, data from the data memory through the dynamic data path in accordance with the modified stored configuration.

10. A method according to claim 9, a plurality of adaptive data routers arranged to route data from the data memory through the dynamic data path.

11. A method according to claim 10, wherein the plurality of adaptive data routers are provided in parallel.

12. A method according to claim 9, wherein each adaptive data router is coupled to the configuration memory and is adapted to receive configuration information from the configuration generator, wherein the adaptive data router acts in accordance with the stored configuration in the absence of configuration information, and acts according to the modified configuration when configuration information is received from the configuration generator.

13. A method according to claim 9, wherein the run-time variables are dependent upon run-time data access patterns.

14. A method according to claim 9, wherein the circuit is a field programmable gate array.

\* \* \* \* \*